United States Patent
Wang et al.

(10) Patent No.: US 12,267,045 B2
(45) Date of Patent: Apr. 1, 2025

(54) WEAK-SIGNAL READING CIRCUIT FOR SENSOR

(71) Applicant: SUN YAT-SEN UNIVERSITY, Guangzhou (CN)

(72) Inventors: Kai Wang, Guangzhou (CN); Huimin Li, Guangzhou (CN); Xianda Zhou, Guangzhou (CN)

(73) Assignee: Sun Yat-Sen University, Guangzhou (CN)

( * ) Notice: Subject to any disclaimer, the term of this patent is extended or adjusted under 35 U.S.C. 154(b) by 187 days.

(21) Appl. No.: 18/016,596

(22) PCT Filed: Aug. 26, 2020

(86) PCT No.: PCT/CN2020/111377
§ 371 (c)(1),
(2) Date: May 4, 2023

(87) PCT Pub. No.: WO2022/011790
PCT Pub. Date: Jan. 20, 2022

(65) Prior Publication Data
US 2023/0283236 A1    Sep. 7, 2023

(30) Foreign Application Priority Data
Jul. 17, 2020   (CN) .......................... 202010690270.5

(51) Int. Cl.
*H03F 1/02* (2006.01)
*H03F 3/16* (2006.01)

(52) U.S. Cl.
CPC ............. *H03F 1/0205* (2013.01); *H03F 3/16* (2013.01)

(58) Field of Classification Search
CPC ................................ H03F 1/0205; H03F 3/16
See application file for complete search history.

(56) References Cited

U.S. PATENT DOCUMENTS

| | | | |
|---|---|---|---|
| 2014/0027639 A1 | 1/2014 | Yang et al. | |
| 2018/0011053 A1* | 1/2018 | Hadwen | G01N 27/4148 |

FOREIGN PATENT DOCUMENTS

| | | |
|---|---|---|
| CN | 103135861 | 6/2013 |
| CN | 104167998 | 11/2014 |

(Continued)

OTHER PUBLICATIONS

PCT/ISA/210 Search Report issued on PCT/CN2020/111377, Mar. 31, 2021 pp. 5.

(Continued)

*Primary Examiner* — Metasebia T Retebo
(74) *Attorney, Agent, or Firm* — The Farrell Law Firm, P.C.

(57) ABSTRACT

Provided is a weak-signal reading circuit for a sensor, comprising a sensing signal input amplifying unit and a signal reading unit. The sensing signal input amplifying unit comprises a first transistor, wherein a gate and a drain of the first transistor are connected with a sensor; the signal reading unit is connected to a source of the first transistor, the first transistor is turned on when the sensor generates a sensing signal, so that the sensing signal is captured by the signal reading unit. When the sensor senses a signal and generates a voltage, the first transistor tends to be switched on, then the signal reading unit reads the sensing signal through the first transistor which has been turned on, that is, by providing the first transistor, the weak-signal reading circuit for sensor can be self-driven according to the voltage generated by the sensor without an extra drive circuit, thereby achieving low power consumption.

11 Claims, 5 Drawing Sheets

(56) References Cited

FOREIGN PATENT DOCUMENTS

| | | | |
|---|---|---|---|
| CN | 107005659 | | 8/2017 |
| CN | 106791511 B | * | 7/2019 |

OTHER PUBLICATIONS

PCT/ISA/237 Written Opinion issued on PCT/CN2020/111377, Mar. 31, 2021, pp. 6.

* cited by examiner

WEAK-SIGNAL READING CIRCUIT FOR SENSOR

CROSS REFERENCE TO RELATED APPLICATION(S)

This application is a National Phase entry of PCT Application PCT/CN2020/111377, filed on Aug. 26, 2020, and claims priority to Chinese Application No. 202010690270.5, filed on Jul. 17, 2020, the entire contents of each which are incorporated herein by reference.

TECHNICAL FIELD

The following relates to a field of reading signal from sensor, in particular to the field of a weak-signal reading circuit for sensor.

BACKGROUND OF INVENTION

With the booming development in the fields such as the Internet of Things and the Artificial Intelligence, various sensors are used for data collection and signal detection, and the detected signals are analyzed for further application. For example, in recent years, the mobile intelligent devices and wearable intelligent devices can obtain information about human movement and human health and the like in real time by using optical, electrical, biological and chemical sensors; usually, a weak-signal detection by the sensor is a process which converts a measured physical volume to an electrical signal that can be easily output and read, and the electrical signal is further output to a signal amplify ing integrated circuit for processing. There are various sensors with different working principles, such as a photoelectric sensor, a resistive sensor, a capacitive sensor and a piezoelectric sensor, etc.

In the prior arts, the conventional weak-signal reading circuits for sensor suffer from high power consumption, complex circuit design, long delay response, serious cross-talk, and low-level integration, and the electrical signal that can be obtained is highly dependence on the reliability and stability of the active modules such as transistors and power supply.

SUMMARY OF THE INVENTION

In order to resolve the issues mentioned above, the present invention provides a weak-signal reading circuit for a sensor, in the followings:

A weak signal reading circuit for a sensor, comprising,
a sensing signal input amplifying unit, comprising a first transistor, wherein a gate and a drain of the first transistor are connected with a sensor;
a signal reading unit, which is connected with a source of the first transistor, the first transistor is turned on when the sensor generates a sensing signal, and the sensing signal is captured by the signal reading unit.

The present invention has following technical advantages as compared to the prior art.

When the sensor senses a signal and generates a voltage, the first transistor tends to be turned on, at this time, the signal reading unit reads the sensing signal from the sensor via the first transistor which has been turned on, that is, by providing the first transistor, the weak-signal reading circuit for sensor can be self-driven according to the voltage generated by the sensor without an extra drive circuit, thereby achieving low power consumption.

As a further improvement of the present invention, the signal reading unit comprises a second transistor and a first capacitor, wherein a drain of the second transistor is connected with the source of the first transistor, the drain of the second transistor is grounded via the first capacitor, a gate of the second transistor is used to receive a scanning signal, a source of the second transistor is connected with a signal output unit.

As a further improvement of the present invention, the first transistor is selected from a thin film transistor, a metal oxide semiconductor field effect transistor or a tunneling field effect transistor.

As a further improvement of the present invention, the second transistor is selected from a thin film transistor, a metal oxide semiconductor field effect transistor or a tunneling field effect transistor.

As a further improvement of the present invention, the first transistor is a single-gate transistor.

As a further improvement of the present invention, the first transistor is a dual-gate transistor, a top gate and a bottom gate of the first transistor are both connected with the sensor.

As a further improvement of the present invention, both of the sensing signal input amplifying unit and the signal reading unit can be extended to an array.

As a further improvement of the present invention, further comprising the signal output unit which is connected with the signal reading unit, to amplify and output the sensing signal.

As a further improvement of the present invention, the signal output unit comprises an operational amplifier, a resistor, and a second capacitor, wherein the source of the second transistor is connected with an inverting input of the operational amplifier, a non-inverting input of the operational amplifier is grounded, an output of the operational amplifier is connected with the inverting input of the operational amplifier via the resistor, and the output of the operational amplifier is connected with the inverting input of the operational amplifier via the second capacitor.

BRIEF DESCRIPTION OF DRAWINGS

Embodiments of the present invention will be explained in detail with the accompany drawings, wherein.

DETAILED DESCRIPTION OF THE INVENTION

Preferred embodiments of the present invention are described in detail hereinafter with reference to the drawings, it will be appreciated that the preferred embodiments are merely for illustrating and explaining the present invention, and are not intended to limit the invention.

Embodiment 1

Figure 1:
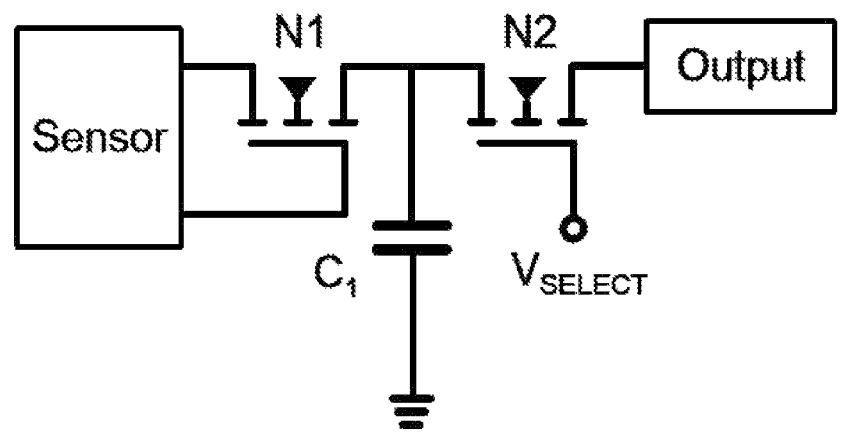
FIG. 1 is a circuit diagram of the weak-signal reading circuit for sensor according to Embodiment 1.

This embodiment provides a weak-signal reading circuit for sensor, which can be applied to a specific device, such as an intelligent handheld device, an intelligent wearable device, and a human-computer interface, etc. As shown in FIG. 1, the weak-signal reading circuit for sensor comprises a sensing signal input amplifying unit and a signal reading unit, wherein the sensing signal input amplifying unit comprises a first transistor N1 which is a single-gate transistor, where a gate and a drain of the first transistor N1 are connected with the sensor, and a source of the first transistor N1 is connected with the signal reading unit. The first transistor N1 is turned on when the sensor generates a sensing signal, so that the sensing signal can be captured by the signal reading unit.

Figure 3:
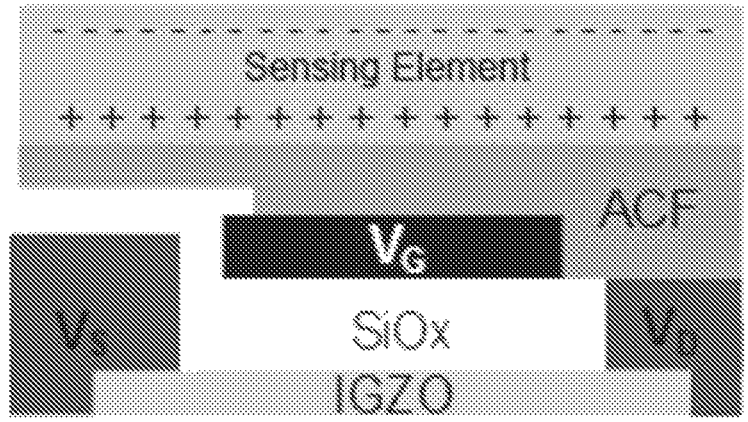
FIG. 3 is a schematic diagram illustrating an internal structure of the first transistor according to the Embodiments 1-3.
Figure 4:
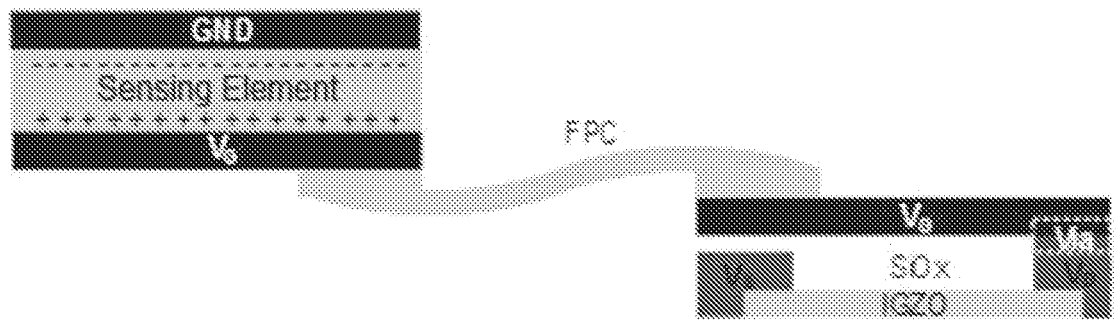
FIG. 4 is a schematic diagram illustrating the connection to the first transistor according to the Embodiment 1-3.

The sensor in this embodiment is a piezoelectric element, a pressure sensitive element, a photosensitive element, a biosensing element or a chemical sensing element. As shown in FIG. 3 and FIG. 4, the sensor is connected with the first transistor N1 by direct fabrication on the circuit or using anisotropic conductive adhesive or other bonding materials, a surface electrode of the sensor is connected with the first transistor N1 via a flexible printed circuit board of which the substrate is a polyester film or the similar material.

Figure 2:
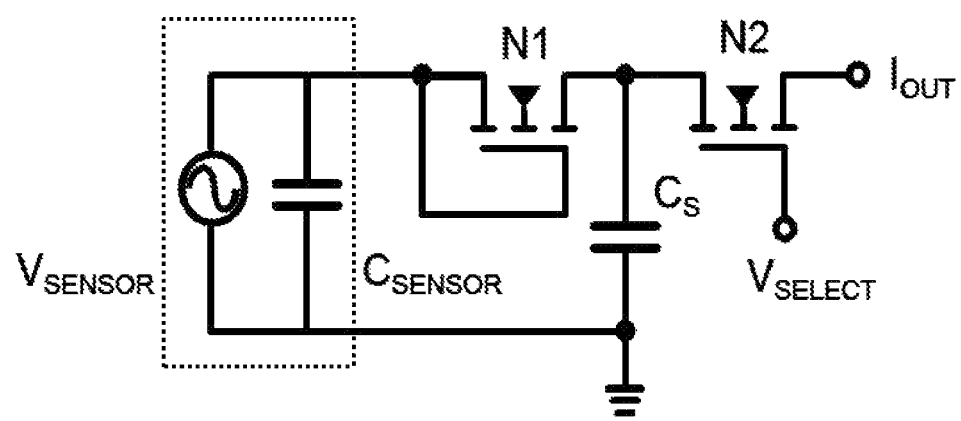
FIG. 2 is the equivalent circuit diagram of the circuit according to the Embodiment 1.

Preferably, as shown in FIG. 2, the sensor in this embodiment is a piezoelectric element made of polarized polyvinylidene fluoride material, including polyvinylidene fluoride trifluoroethylene, barium titanate, piezoelectric ceramics and zinc oxide; the equivalent circuit of piezoelectric film PVDF is formed by parallel connection of a voltage source $V_{SENSOR}$ and a capacitor $C_{SENSOR}$.

In this embodiment, the signal reading unit comprise a second transistor N2 and a first capacitor C1, wherein a drain of the second transistor N2 is connected with the source of the first transistor N1 and is also grounded via the first capacitor C1, a gate of the second transistor N2 is used to receive a scanning signal, and a source of the second transistor is connected with a signal output unit, wherein the first capacitor C1 includes two metal electrodes which include but not limit to the following combination—one metal electrode and one gate of a transistor, one metal electrode and one source or drain of a transistor, one source of the first transistor and one drain of the second transistor, etc.

Preferably, the first transistor N1 is selected from a thin film transistor, a metal oxide semiconductor field effect transistor or a tunneling field effect transistor, and the second transistor N2 is selected from a thin film transistor, a metal oxide semiconductor field effect transistor or a tunneling field effect transistor. The thin film transistor is produced by amorphous indium gallium zinc oxide, or by the technologies including but not limiting to one or more of amorphous silicon film transistor technology, polysilicon film transistor technology, organic film transistor technology, etc.

Further, the weak-signal reading circuit for sensor in this embodiment comprises a signal output unit connected with the signal reading unit, in order to amplify and output the sensing signal.

Furthermore, the signal output unit comprises an operational amplifier U1, a resistor R1 and a second capacitor C2, wherein the source of the second transistor N2 is connected with an inverting input of the operational amplifier U1, a non-inverting input of the operational amplifier U1 is grounded, an output of the operational amplifier U1 is connected with the inverting input of the operational amplifier U1 via the resistor R1, and the output of the operational amplifier U1 is connected with the inverting input of the operational amplifier U1 via the second capacitor C2.

Figure 6:
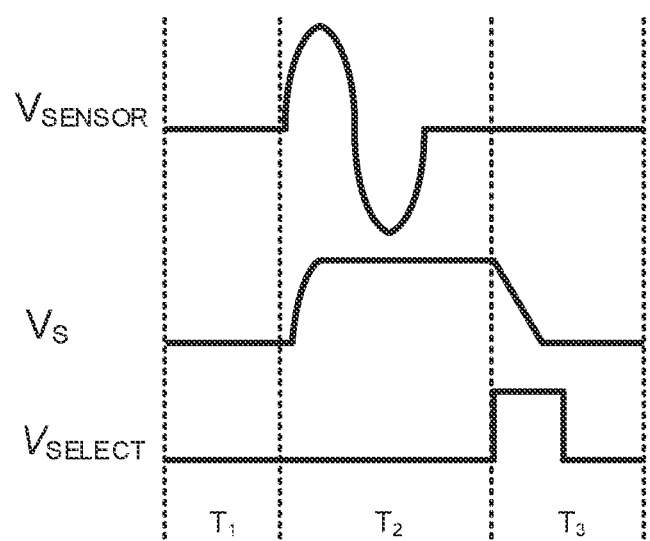
FIG. 6 is a time sequence diagram of scanning signal connected by the signal reading unit according to the first embodiment to the second embodiment.

This embodiment is further explained in combination with the specific implementation process, as follows:

As shown in FIG. 6, on the process of signal reading, input a scanning signal, the input of the scanning signal comprises three phases including a signal reset phase, a signal collecting phase, and a signal reading phase.

1. During the signal reset phase, both $V_{SENSOR}$ and $V_{SELECT}$ are reset to low level;
2. During the signal collecting phase, the piezoelectric film is pressed to generate a positive voltage signal, making the first transistor N1 tend to be switched on, then the storage capacitor C1 in the unit is charged through the rectification of the first transistor N1; when the piezoelectric film is no longer pressed immediately, a negative voltage signal is generated to make the first transistor N1 switch off, then the amount of charge stored on the first capacitor C1 remains unchanged, and the voltage VS across the first capacitor C1 remains unchanged.
3. During the signal reading phase, $V_{SELECT}$ of the scanning signal is biased to a positive voltage, the second transistor N2 is turned on, and the charge stored on the first capacitor C1 is read by a periphery circuit; when the charge stored has been read, the $V_{SELECT}$ of the scanning signal falls to a low level.

Based on the forementioned features, the weak-signal reading circuit for sensor according to this embodiment can be self-driven without an extra drive circuit, thereby achieving the advantage of low power consumption.

Embodiment 2

Figure 5:
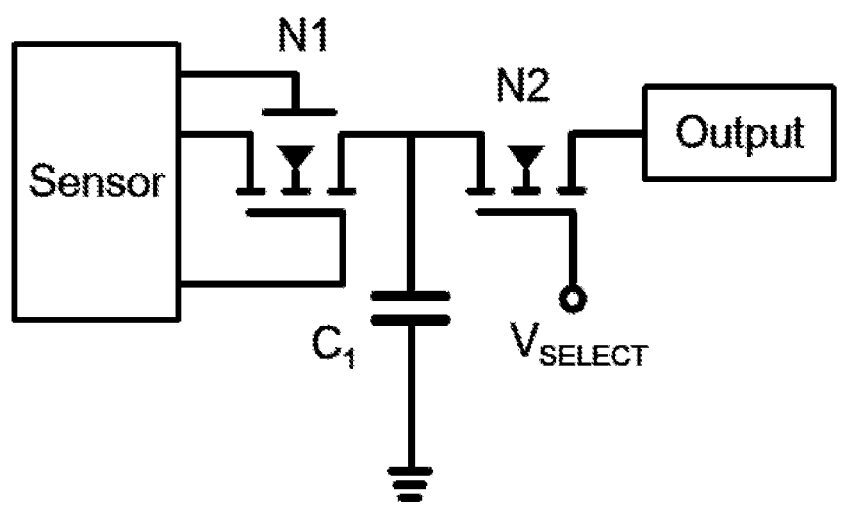
FIG. 5 is a circuit diagram of the weak-signal reading circuit for sensor according to Embodiment 2.

This embodiment provides another weak-signal reading circuit for sensor, as shown in FIG. 5, the weak-signal reading circuit for sensor comprises a sensing signal input amplifying unit and a signal reading unit, wherein the sensing signal input amplifying unit comprises a first transistor N1 which is a multi-gate transistor, where a top gate and a bottom gate of the first transistor N1 are both connected with the sensor, and a source of the first transistor N1 is connected with the signal reading unit. The first transistor N1 is turned on when the sensor generates a sensing signal, so that the sensing signal can be captured by the signal reading unit.

The sensor in this embodiment is a piezoelectric element, a pressure sensitive element, a photosensitive element, a biosensing element or a chemical sensing element. As shown in FIG. 3 and FIG. 4, the sensor is connected with the first transistor N1 by direct fabrication on the circuit or using anisotropic conductive adhesive or other bonding materials, a surface electrode of the sensor is connected with the first transistor N1 via a flexible printed circuit board of which the substrate is a polyester film or the similar material.

Preferably, the sensor in this embodiment is a piezoelectric element made of polarized polyvinylidene fluoride material, including polyvinylidene fluoride trifluoroethylene, barium titanate, piezoelectric ceramics and zinc oxide; the equivalent circuit of piezoelectric film PVDF is formed by parallel connection of a voltage source $V_{SENSOR}$ and a capacitor $C_{SENSOR}$.

In this embodiment, the signal reading unit comprise a second transistor N2 and a first capacitor C1, wherein a drain of the second transistor N2 is connected with the source of the first transistor N1 and is also grounded via the first capacitor C1, a gate of the second transistor N2 is used to receive a scanning signal, and a source of the second transistor is connected with a signal output unit, wherein the first capacitor C1 includes two metal electrodes which include but not limit to the following combination—one metal electrode and one gate of a transistor, one metal electrode and one source or drain of a transistor, one source of the first transistor and one drain of the second transistor, etc.

Preferably, the first transistor N1 is select from a thin film transistor, a metal oxide semiconductor field effect transistor or a tunneling field effect transistor, and the second transistor N2 is selected from a thin film transistor, a metal oxide semiconductor field effect transistor or a tunneling field effect transistor. The thin film transistor is produced by amorphous indium gallium zinc oxide, or by the technologies including but not limiting to one or more of amorphous silicon film transistor technology, polysilicon film transistor technology, organic film transistor technology, etc.

Further, the weak-signal reading circuit for sensor in this embodiment comprises a signal output unit connected with the signal reading unit in order to amplify and output the sensing signal.

Furthermore, the signal output unit comprises an operational amplifier U1, a resistor R1, and a second capacitor C2, wherein the source of the second transistor N2 is connected with an inverting input of the operational amplifier U1, a non-inverting input of the operational amplifier U1 is grounded, an output of the operational amplifier U1 is connected with the inverting input of the operational amplifier U1 via the resistor R1, and the output of the operational amplifier U1 is connected with the inverting input of the operational amplifier U1 via the second capacitor C2.

For the specific implementation process of this embodiment, please see embodiment 1 and will not be explained in details herein.

Embodiment 3

Figure 8:
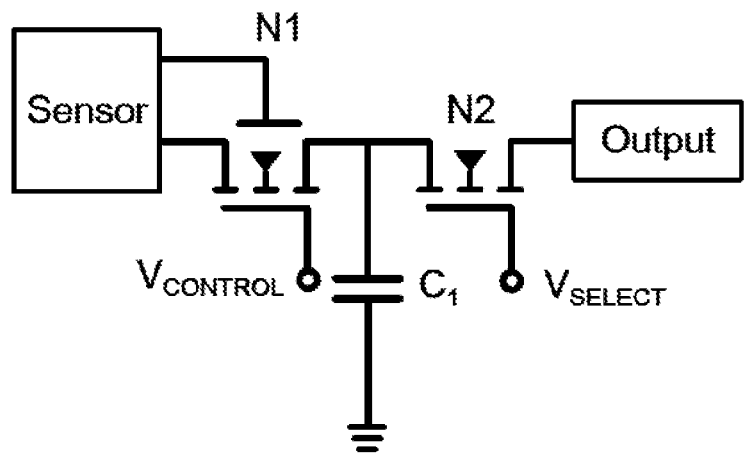
FIG. 8 is a circuit diagram of a weak-signal reading circuit for sensor according to a third embodiment.

This embodiment provides a weak-signal reading circuit for sensor, as shown in FIG. 8, comprising a sensing signal input amplifying unit and a signal reading unit, wherein the sensing signal input amplifying unit comprises a first transistor N1 which is a dual-gate transistor, where a bottom gate and a drain of the first transistor N1 are connected with the sensor, a top gate of the first transistor N1 is connected with a control voltage, and a source of the first transistor N1 is connected with the signal reading unit. The first transistor N1 is turned on when the sensor generates a sensing signal, so that the sensing signal can be captured by the signal reading unit.

The sensor in this embodiment is a piezoelectric element, a pressure sensitive element, a photosensitive element, a biosensing element or a chemical sensing element. As shown in FIG. 3 and FIG. 4, the sensor is connected with the first transistor N1 by direct fabrication on the circuit or using anisotropic conductive adhesive or other bonding materials, a surface electrode of the sensor is connected with the first transistor N1 via a flexible printed circuit board of which the substrate is a polyester film or the similar material.

Preferably, the sensor in this embodiment is a piezoelectric element made of polarized polyvinylidene fluoride material, including polyvinylidene fluoride trifluoroethylene, barium titanate, piezoelectric ceramics and zinc oxide; the equivalent circuit of piezoelectric film PVDF is formed by parallel connection of a voltage source $V_{SENSOR}$ and a capacitor $C_{SENSOR}$.

In this embodiment, the signal reading unit comprise a second transistor N2 and a first capacitor C1, wherein a drain of the second transistor N2 is connected with the source of the first transistor N1 and is also grounded via the first capacitor C1, a gate of the second transistor N2 is used to receive a scanning signal, and a source of the second transistor is connected with a signal output unit.

Preferably, the first transistor N1 is selected from a thin film transistor, a metal oxide semiconductor field effect transistor or a tunneling field effect transistor, and the second transistor N2 is selected from a thin film transistor, a metal oxide semiconductor field effect transistor or a tunneling field effect transistor; The thin film transistor is produced by amorphous indium gallium zinc oxide, or by the technologies including but not limiting to one or more of amorphous silicon film transistor technology, polysilicon film transistor technology, organic film transistor technology, etc.

Further, the weak-signal reading circuit for sensor in this embodiment comprises a signal output unit connected with the signal reading unit in order to amplify and output the sensing signal.

Specifically, the signal output unit comprises an operational amplifier U1, a resistor R, and a second capacitor C2, wherein the source of the second transistor N2 is connected with an inverting input of the operational amplifier U1, a non-inverting input of the operational amplifier U1 is grounded, an output of the operational amplifier U1 is connected with the inverting input of the operational amplifier U1 via the resistor R, and the output of the operational amplifier U1 is connected with the inverting input of the operational amplifier U1 via the second capacitor C2.

Figure 9:
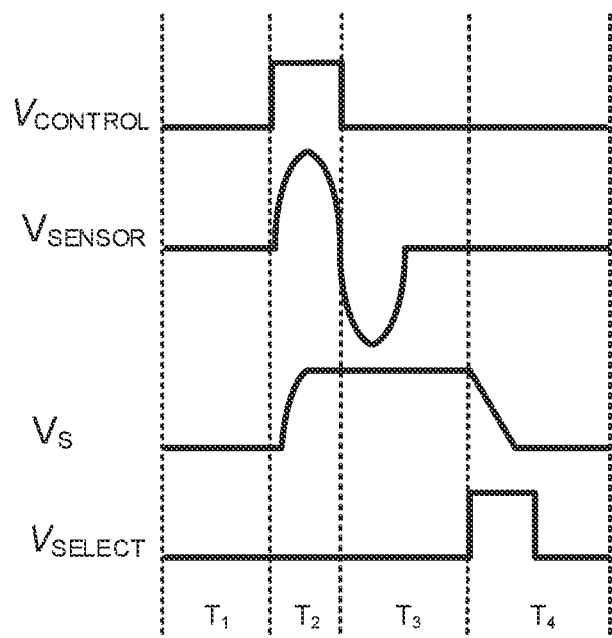
FIG. 9 is a time sequence diagram of scanning signal connected by the signal reading unit according to the third embodiment.

This embodiment is further explained in combination with the specific implementation process, as follows:

As shown in FIG. 9, on the process of signal reading, input a scanning signal, the input of the scanning signal comprises three phases including a signal reset phase, a signal collecting phase, and a signal reading phase.

1. During the signal reset phase, $V_{CONTROL}$, $V_{SENSOR}$ and $V_{SELECT}$ are all reset to low level;
2. During the signal collecting phase, the piezoelectric film is pressed to generate a positive voltage signal, $V_{CONTROL}$ is biased to high level, making the first transistor N1 tend to be switched on, then the storage capacitor C1 in the unit is charged via the first transistor N1; when the piezoelectric film is no longer pressed immediately, $V_{CONTROL}$ is biased to low level, then the amount of charge stored on the first capacitor C1 remains unchanged, and the voltage VS across the first capacitor C1 remains unchanged.
3. During the signal reading phase, $V_{CONTROL}$ of the control signal is biased to low level, $V_{SELECT}$ of the scanning signal is biased to high level, and the second transistor N2 is turned on, and the charge stored on the first capacitor C1 is read by a periphery circuit; when the charge stored has been read, the $V_{SELECT}$ of the scanning signal falls to a low level.

Based on the forementioned features, the weak-signal reading circuit for sensor according to this embodiment can be self-driven without an extra drive circuit, thereby achieving the advantage of low power consumption.

Embodiment 4

Figure 7:
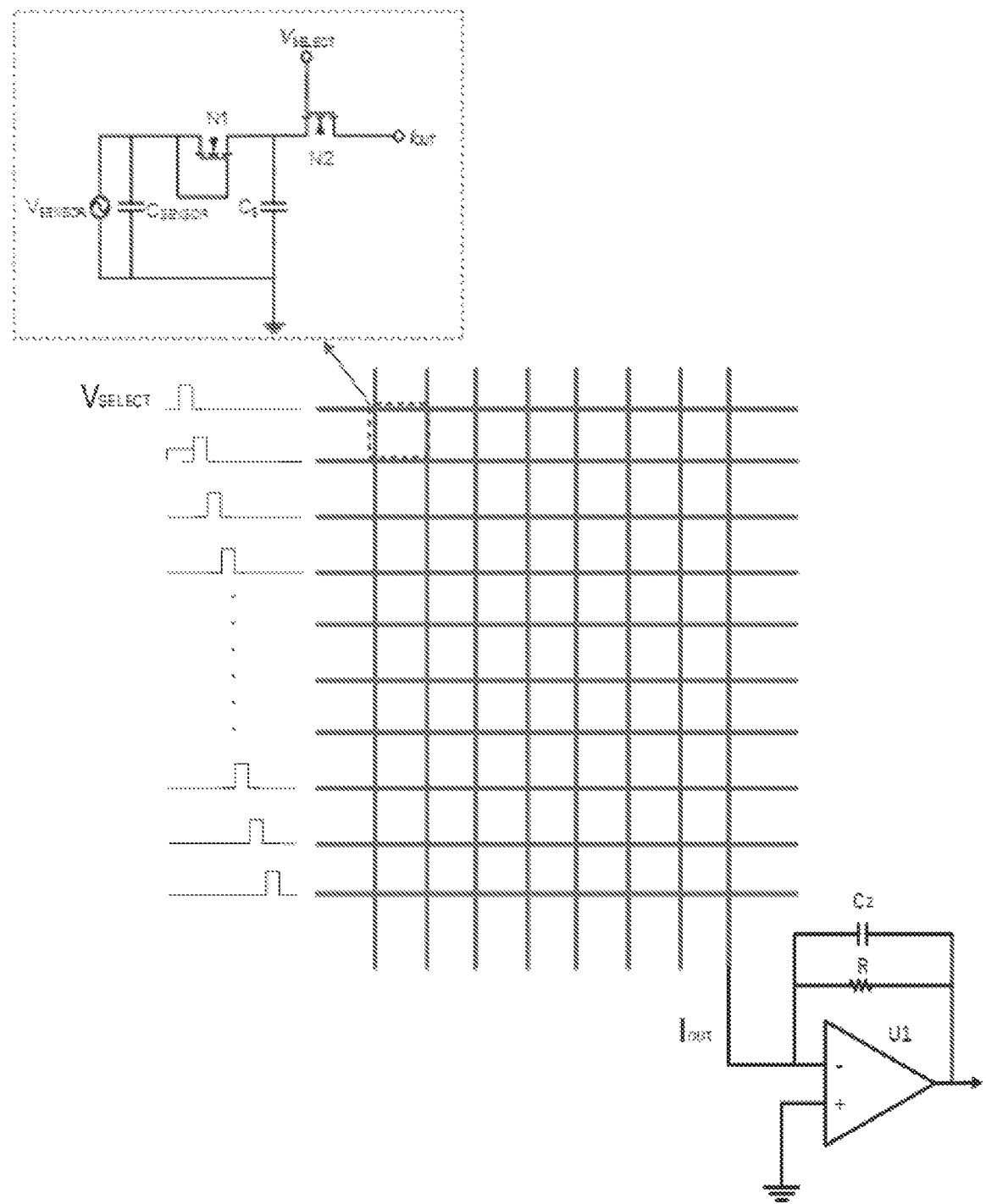
FIG. 7 is a schematic diagram of an array of the weak-signal reading circuit for sensor according to the first embodiment to the second embodiment.

This embodiment provides an array of a weak-signal reading circuit for sensor according to embodiment 1 and embodiment 2, where both the sensing signal input amplifying unit and the signal reading unit can be extended to an array, thereby forming an array of a weak-signal reading circuit for sensor, wherein a row selection switch is controlled by a scan drive circuit or an analog multiplexer, an output of the sensing signal is connected with the signal amplifying circuit; the number of control channels and the number of signal output depends on the number and the form of sensor extension, as shown in FIG. 7, an array of 9 rows and 7 columns sensors is illustrated. Given that a weak-signal reading circuit for sensor is regarded as a "pixel", a row selection control $V_{SELECT}$ of all the pixels in each row of the sensor array has a short circuit, and there are 9 channels where a pulsing signal is provided by a dedicated scan drive chip or a multi-channel analog switch; meanwhile a signal output IOUT of all the pixels in each column has a short circuit, and is connected with a channel of the weak-signal amplifying circuit of the output unit, there are 7 channels.

The process of the weak-signal reading circuit for sensor according to embodiment 3 to be extended to an array is similar with the abovementioned embodiment and will not be explained in details herein. Besides, electronic transistors are applied in the examples herein, but hole transistors are also applicable in the abovementioned circuit.

The embodiment described hereinbefore is merely preferred embodiment of the present invention and not for purposes of any restrictions or limitations on the invention. It will be apparent that any non-substantive, obvious alterations or improvement by the technician of this technical field according to the present invention may be incorporated into ambit of claims of the present invention.

The invention claimed is:

1. A weak-signal reading circuit for sensor, comprising,
a sensing signal input amplifying unit including a first transistor, wherein a gate and a drain of the first transistor are connected with a sensor; and
a signal reading unit, which is connected with a source of the first transistor,
wherein the first transistor is turned on when the sensor generates a sensing signal, and the sensing signal is captured by the signal reading unit,
wherein the signal reading unit comprises a second transistor and a first capacitor, and
wherein a drain of the second transistor is connected with the source of the first transistor, the drain of the second transistor is grounded via the first capacitor, a gate of the second transistor is used to receive a scanning signal, and a source of the second transistor is connected with a signal output unit.

2. The circuit of claim 1, wherein the first transistor is selected from a thin film transistor, a metal oxide semiconductor field effect transistor, or a tunneling field effect transistor.

3. The circuit of claim 2, wherein the second transistor is selected from a thin film transistor, a metal oxide semiconductor field effect transistor, or a tunneling field effect transistor.

4. The circuit of claim 1, wherein the first transistor is a single-gate transistor.

5. The circuit of claim 1, wherein the first transistor is a dual-gate transistor, and
wherein a top gate and a bottom gate of the first transistor are both connected with the sensor.

6. The circuit of claim 1, wherein both of the sensing signal input amplifying unit and the signal reading unit can be extended to an array.

7. The circuit of claim 1, further comprising the signal output unit which is connected with the signal reading unit, to amplify and output the sensing signal.

8. The circuit of claim 1, wherein the signal output unit comprises an operational amplifier, a resistor, and a second capacitor, and
wherein the source of the second transistor is connected with an inverting input of the operational amplifier, a non-inverting input of the operational amplifier is grounded, an output of the operational amplifier is connected with the inverting input of the operational amplifier via the resistor, and the output of the operational amplifier is connected with the inverting input of the operational amplifier via the second capacitor.

9. A weak-signal reading circuit for sensor, comprising,
a sensing signal input amplifying unit including a first transistor, wherein a bottom gate and a drain of the first transistor are connected to a sensor, a top gate of the first transistor is connected with a control voltage; and
a signal reading unit, which is connected with a source of the first transistor,
wherein the first transistor is turned on when the sensor generates a sensing signal, and the sensing signal is captured by the signal reading unit,
wherein the signal reading unit comprises a second transistor and a first capacitor, and
wherein a drain of the second transistor is connected with the source of the first transistor, the drain of the second transistor is grounded via the first capacitor, a gate of the second transistor is used to receive a scanning signal, and a source of the second transistor is connected with a signal output unit.

10. The circuit of claim 9, wherein both of the sensing signal input amplifying unit and the signal reading unit can be extended to an array.

11. The circuit of claim 9, further comprising a signal output unit which is connected with the signal reading unit, to amplify and output the sensing signal.

* * * * *